(12) United States Patent
Dror et al.

(10) Patent No.: US 8,301,987 B2
(45) Date of Patent: Oct. 30, 2012

(54) SYSTEM AND METHOD OF DECODING DATA WITH REDUCED POWER CONSUMPTION

(75) Inventors: Itai Dror, Omer (IL); Alexander Berger, Mizpe Ramon (IL)

(73) Assignee: Sandisk IL Ltd., Kfar Saba (IL)

( * ) Notice: Subject to any disclaimer, the term of this patent is extended or adjusted under 35 U.S.C. 154(b) by 442 days.

(21) Appl. No.: 12/608,411

(22) Filed: Oct. 29, 2009

(65) Prior Publication Data

US 2011/0107188 A1 May 5, 2011

(51) Int. Cl.
*G06F 11/00* (2006.01)
(52) U.S. Cl. .................................. 714/785; 714/773
(58) Field of Classification Search .............. 714/752, 714/773, 781, 782, 784, 785; 375/240.24; 713/300, 320
See application file for complete search history.

(56) References Cited

U.S. PATENT DOCUMENTS

| | | | |
|---|---|---|---|
| 4,665,523 A | 5/1987 | Citron et al. | |
| 5,379,305 A | 1/1995 | Weng | |
| 5,384,786 A | 1/1995 | Dudley et al. | |
| 5,483,236 A | 1/1996 | Bi | |
| 5,875,200 A | 2/1999 | Glover et al. | |
| 6,092,233 A | 7/2000 | Yang | |
| 6,511,280 B1 | 1/2003 | Sammartino et al. | |
| 6,954,892 B2 * | 10/2005 | Lee et al. ............... | 714/784 |
| 7,036,068 B2 | 4/2006 | Davis et al. | |
| 7,096,409 B2 | 8/2006 | Banks | |
| 7,222,286 B2 | 5/2007 | Kim | |
| 2003/0028842 A1 | 2/2003 | Katayama et al. | |
| 2003/0101406 A1 * | 5/2003 | Song ....................... | 714/774 |
| 2004/0083333 A1 | 4/2004 | Chang et al. | |
| 2007/0266291 A1 | 11/2007 | Toda et al. | |
| 2009/0063937 A1 | 3/2009 | Au et al. | |
| 2009/0094470 A1 | 4/2009 | Gao et al. | |
| 2010/0058146 A1 * | 3/2010 | Weingarten et al. ........ | 714/773 |
| 2010/0199149 A1 * | 8/2010 | Weingarten et al. ........ | 714/773 |

OTHER PUBLICATIONS

Atti, Nadia Ben et al. "The Berlekamp-Massey Algorithm Revisited," Applicable Algebra in Engineering, Communication and Computing, vol. 17, No. 1, Apr. 2006, 7 pages.
Liu, Chih-Wei et al. "A View of Gaussian Elimination Applied to Early-Stopped Berlekamp-Massey Algorithm," IEEE Transactions on Communications, vol. 55, No. 6, Jun. 2007, pp. 1131-1143.
Dumas, Jean-Guillaume et al. "Computing the Rank of Large Sparse Matrices Over Finite Fields," CASC, 2002, pp. 1-15.
Lee, Wen-Shin "Early Termination Strategies in Sparse Interpolation Algorithms," North Carolina State University, Raleigh, North Carolina, 2001, 117 pages.
Blahut, R.E. "Theory and Practice of Error Control Codes," 1984, Addison Wesley, XP-002615492, pp. 174-191, 252.
The International Search Report and Written Opinion mailed Jan. 27, 2011 in International Application No. PCT/US2010/054224, 11 pages.

* cited by examiner

*Primary Examiner* — Scott Baderman
*Assistant Examiner* — Joseph Kudirka
(74) *Attorney, Agent, or Firm* — Toler Law Group, PC

(57) ABSTRACT

A decoder is disclosed that can reduce power consumption at different stages of a decoding process. At a first stage where the decoder calculates residual values, the decoder can reduce power consumption by calculating residual values using less than a full set of division circuits. A reduced number of division circuits may be sufficient to successfully calculate residuals associated with the codeword to complete the decoding process. Division circuits that are not used may be disabled to reduce power consumption. At another stage of the decoding process where the decoder generates coefficients that are used to identify locations of errors in the codeword, the decoding process can limit power consumption by reducing the number of iterations of a polynomial generator by incorporating termination decision circuitry.

24 Claims, 11 Drawing Sheets

Table 1

| $\mu$ | $\sigma^{(\mu)}(X)$ | $X^{2(\mu-\rho)}\sigma^{(\rho)}(X)$ | $d_{\mu+1}$ |
|---|---|---|---|
| 0 | 1 | $\alpha^0 X$ | $\alpha^{195}$ |
| 1 | $1+\alpha^{195}X$ | $\alpha^0 X^2$ | $\alpha^{92}$ |
| 2 | $1+\alpha^{195}X+\alpha^{152}X^2$ | $\alpha^0 X^2+\alpha^{195}X^3$ | $\alpha^{146}$ |
| 3 | $1+\alpha^{195}X+\alpha^{193}X^2+\alpha^{249}X^3$ | $\alpha^0 X^2+\alpha^{195}X^3+\alpha^{152}X^4$ | 0 |
| 4 | $1+\alpha^{195}X+\alpha^{193}X^2+\alpha^{249}X^3$ | $\alpha^0 X^4+\alpha^{195}X^5+\alpha^{152}X^6$ | 0 |
| 5 | $1+\alpha^{195}X+\alpha^{193}X^2+\alpha^{249}X^3$ | $\alpha^0 X^6+\alpha^{195}X^7+\alpha^{152}X^8$ | 0 |
| 6 | $1+\alpha^{195}X+\alpha^{193}X^2+\alpha^{249}X^3$ | $\alpha^0 X^8+\alpha^{195}X^9+\alpha^{152}X^{10}$ | 0 |
| 7 | $1+\alpha^{195}X+\alpha^{193}X^2+\alpha^{249}X^3$ | $\alpha^0 X^{10}+\alpha^{195}X^{11}+\alpha^{152}X^{12}$ | 0 |
| 8 | $1+\alpha^{195}X+\alpha^{193}X^2+\alpha^{249}X^3$ | $\alpha^0 X^{12}+\alpha^{195}X^{13}+\alpha^{152}X^{14}$ | 0 |
| 9 | $1+\alpha^{195}X+\alpha^{193}X^2+\alpha^{249}X^3$ | $\alpha^0 X^{14}+\alpha^{195}X^{15}+\alpha^{152}X^{16}$ | 0 |
| 10 | $1+\alpha^{195}X+\alpha^{193}X^2+\alpha^{249}X^3$ | $\alpha^0 X^{16}+\alpha^{195}X^{17}+\alpha^{152}X^{18}$ | 0 |
| 11 | $1+\alpha^{195}X+\alpha^{193}X^2+\alpha^{249}X^3$ | | |

Table 2

| $\mu$ | $\sigma^{(\mu)}(X)$ | $X^{2(\mu-\rho)}\sigma^{(\rho)}(X)$ | $d_{\mu+1}$ | Probability |
|---|---|---|---|---|
| 0 | 1 | $\alpha^0 X$ | $\alpha^{195}$ | |
| 1 | $1+\alpha^{195}X$ | $\alpha^0 X^2$ | $\alpha^{92}$ | |
| 2 | $1+\alpha^{195}X+\alpha^{152}X^2$ | $\alpha^0 X^2+\alpha^{195}X^3$ | $\alpha^{146}$ | |
| 3 | $1+\alpha^{195}X+\alpha^{193}X^2+\alpha^{249}X^3$ | $\alpha^0 X^2+\alpha^{195}X^3+\alpha^{152}X^4$ | 0 | $1/256 \cong 0.0039$ |
| 4 | $1+\alpha^{195}X+\alpha^{193}X^2+\alpha^{249}X^3$ | $\alpha^0 X^4+\alpha^{195}X^5+\alpha^{152}X^6$ | 0 | $1/256^2 \cong 1.5\text{e-}5$ |
| 5 | $1+\alpha^{195}X+\alpha^{193}X^2+\alpha^{249}X^3$ | $\alpha^0 X^6+\alpha^{195}X^7+\alpha^{152}X^8$ | 0 | $1/256^3 \cong 6\text{e-}8$ |

FIG. 6

SYSTEM AND METHOD OF DECODING DATA WITH REDUCED POWER CONSUMPTION

FIELD OF THE DISCLOSURE

The present disclosure is generally related to data decoding and error correction.

BACKGROUND

During the process of writing data into memory, the data is often encoded with extra bits to form a codeword. In the presence of noise, some of the bits representing the codeword may change, corrupting the original codeword with errors. When data is read from the memory, a decoder may be used to identify and correct the errors using error correction coding (ECC). For example, Bose-Chaudhuri-Hocquenghem (BCH) ECC schemes are commonly used in applications where bit errors tends to be uncorrelated.

Typically, a decoder is designed to correct errors for a worst-case scenario (e.g., a flash memory at the end-of-life or poor flash memory condition due to excessive wear or excessive data retention time). These ECC schemes attempt to correct a maximum number of errors every time error correction is performed. With each read from memory, the typical decoder implements the worst-case scenario ECC scheme. Increasing the level of error correction increases the amount of energy consumed by the decoder. Thus, operating a decoder with an ECC scheme that attempts to correct a maximum number of errors consumes more power than is needed to correct typical usage scenarios.

SUMMARY

A decoder is disclosed that can reduce power consumption at different stages of a decoding process. At a first stage where the decoder calculates residual values, the decoder can reduce power consumption by attempting to calculate the residual values using less than a full set of division circuits. Because codewords are more likely to have fewer errors than to have a worst-case error condition, the reduced number of division circuits may be sufficient to successfully calculate residuals associated with the codeword to complete the decoding process. Division circuits that are not used in the first decoding attempt may be disabled to reduce power consumption.

At another stage of the decoding process where the decoder generates coefficients that are used to identify locations of errors in the codeword, the decoding process can limit power consumption by reducing the number of iterations that a polynomial generator performs to calculate the coefficients. The decoder can reduce the number of iterations performed by incorporating termination decision circuitry that halts the polynomial generation procedure before an absolute convergence. By generating the coefficients in less iterations than that are required for absolute convergence, the decoder may reduce power consumption and may also reduce decoding latency.

BRIEF DESCRIPTION OF THE DRAWINGS

FIG. 6 is an illustration of two tables that include variables associated with a termination condition of an error locator polynomial generator of a decoder;

DETAILED DESCRIPTION

Figure 1:
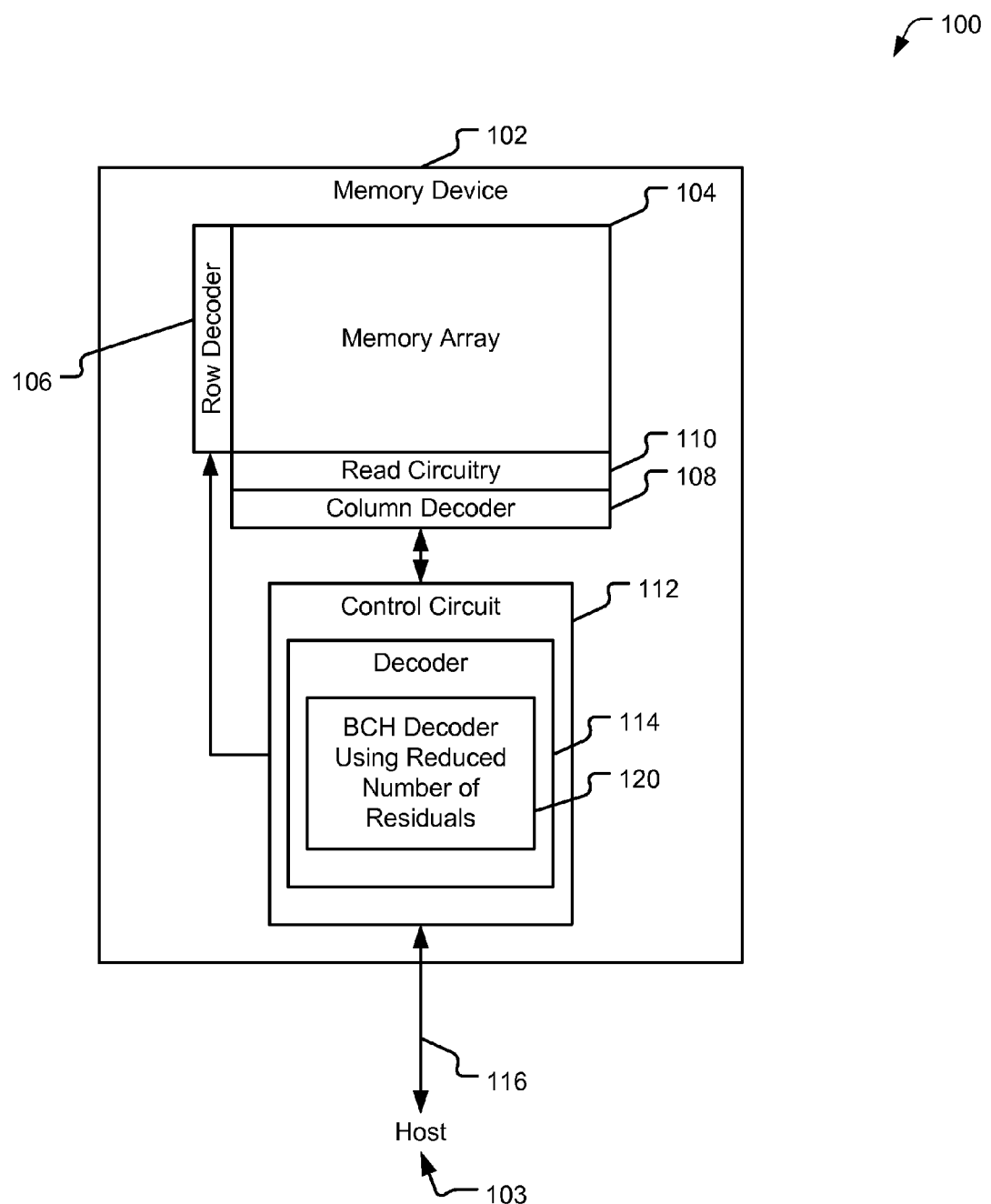
FIG. 1 is a block diagram of a particular illustrative embodiment of a system that includes a BCH decoder that uses a reduced number of residuals.

In a particular embodiment, a method of decoding data at a decoder is disclosed. The method is generally directed to decoding codeword data at a decoder using a partial set of residuals to save power. The decoder is configured to generate multiple residual values to correct errors within a codeword that may have been corrupted. The decoder is adapted to generate a first number of residual values in response to receiving data representing the codeword. The method includes receiving the data representing the codeword, generating a first set of a second number of residual values corresponding to the received data, and determining whether the received data representing the codeword is decodable using the first set of residual values. In response to determining that the received data is decodable using the first set of residual values, the method further includes generating decoded data corresponding to the codeword. The second number of residual values is less than the first number of residual values. For example, the second number of residual values ($r'$) may be less than a number ($p$) of all available residual values that may be used by residuals calculation circuitry within the decoder. One of more residual calculation circuits may be selectively disabled to save power.

In another particular illustrative embodiment, a method of performing error correction decoding is disclosed. The method is performed at an error correction code (ECC) engine including a plurality of residual calculation circuits. The plurality of residual calculation circuits includes a first number ($p$) of residual calculation circuits, where a first number ($t$) of errors of a corrupted codeword are correctable using the first number ($p$) of residual calculation circuits. The method includes selectively disabling an operation of at least one residual calculation circuit to generate a first set of residual values corresponding to the corrupted codeword. The method includes initiating generation of the first set of residual values corresponding to the received data. The first set of residual values has a second number ($r'$) of residual values that is less than the first number (p) of residual calculation circuits. The second number (r') of residual values is determined to correct a second number (r) of errors within the corrupted codeword, where the second number (r) of errors is less than the first number (t) of errors.

In another particular illustrative embodiment, a method of decoding data including early termination of error location polynomial generation is disclosed. The method is performed at a decoder configured to correct a first number of errors within a codeword that has been corrupted. The method includes receiving data representing the corrupted codeword, initiating an iterative convergence scheme to generate an error location polynomial. In each particular iteration of the iterative convergence scheme includes updating an error location polynomial and determining a discrepancy factor corresponding to the particular iteration. The method terminates the iterative convergence scheme in response to a predetermined number of sequential discrepancy factors equaling zero, where the iterative convergence scheme is terminated prior to a degree of the error location polynomial equaling the first number of errors.

In another embodiment, a data decoding device is disclosed. The data decoding device includes an error correction code (ECC) engine configured to generate residual values to correct errors within a codeword that has been corrupted. The ECC engine is adapted to generate a first number (p) of residual values to correct not more than a first number of errors (t) of the corrupted codeword when the corrupted codeword has a first codeword size (s). The ECC engine includes a plurality of residual calculation circuits to generate the residual values and a control logic circuit configured to initiate generation of a first set of residual values corresponding to the received data by selectively disabling an operation of at least one residual calculation circuit. The first set of residual values has a second number (r') of residual values that is less than the first number (p) of residual values.

Referring to FIG. 1, a memory device 102 is shown. The memory device 102 may be coupled via a data connection 116 to a host 103. A combination of the host 103 and the memory device 102 comprises a system 100. The memory device 102 includes a memory array 104 and a control circuit 112. The memory array 104 is coupled to a row decoder 106 and to read circuitry 110. The memory array 104 is also coupled to a column decoder 108. The control circuit 112 controls data read and write access to the memory array 104. The control circuit 112 includes a decoder 114. The decoder 114 may include error correction code generation capabilities. The decoder 114 includes a BCH decoder 120. The BCH decoder 120 may utilize Reed Solomon codes. The BCH decoder 120 uses a reduced number of residuals in determining decoded values. For example, the BCH decoder 120 may have an operating mode where a set of residuals that is less than an entire set of residuals for the decoder 114 is used in the decoding operation. By using a reduced set of residuals, the BCH decoder 120 may perform decoding using less power as compared to using a full set of residual values.

The control circuit 112 may initiate decoding at the decoder 114 in response to receiving input data from the memory array 104. For example, the control circuit 112 may initiate a request to read data from the memory array 104. The control circuit 112 may initiate a memory read by providing a control signal to the row decoder 106 and to the column decoder 108. In response to the control signals sent to the row decoder 106 and to the column decoder 108, the read circuitry 110 may retrieve a selected data element from a selected memory cell or group of memory cells of the memory array 104. The control circuit 112, upon initiating the memory read request, receives data from the memory array 104 from the selected memory address. The data retrieved by the control circuit 112 may include a codeword that has at least one data element that is corrupted. The codeword with the corrupted data is provided to the decoder 114 for correction. The decoder 114, in response to receiving the codeword from the memory array 104, performs error correction using the BCH decoder 120. The decoder 114 may receive data that has been corrupted and may provide as an output corrected data that may be sent to the host 103 via the data connection 116.

The BCH decoder 120 may be used to perform a method of decoding data. The BCH decoder 120 is configured to generate multiple residual values to correct errors within a codeword that has been corrupted. The codeword may be received from the memory array 104 via the control circuit 112. The BCH decoder 120 is adapted to generate a first number of residual values in response to receiving the data representing the corrupted codeword. For example, the BCH decoder 120 may be adapted to generate a full set of residual values (p), where (p) represents a total number of residual values that may be generated by the BCH decoder 120.

The method of decoding includes receiving the data representing the corrupted codeword and generating a first set of a second number of the residual values corresponding to the received data. The second number of the residual values is less than the first number of residual values. For example, a second number of residual values (r') that is less than the first number (p) may be determined or received by circuitry within the BCH decoder 120. The BCH decoder 120 may be capable of decoding data having a maximum number of errors (t) by using the first number of residual values (p) and may also be capable of decoding data having a reduced number of errors (r) using the second number of residual values (r'), where (r) is less than (t).

The method further includes determining whether the received data representing the codeword is decodable using the first set of residual values. For example, the BCH decoder 120 may include logic circuitry to determine whether a reduced number of residual values may be used in order to successfully decode the received data. In response to determining whether the received data is decodable using the first set of residual values (i.e., the reduced number of residual values), the method generates decoded data corresponding to the codeword using the first set of residual values. Thus, by using the first set of residual values with a reduced number of residuals, power consumption may be reduced for a decoding operation.

Figure 2:
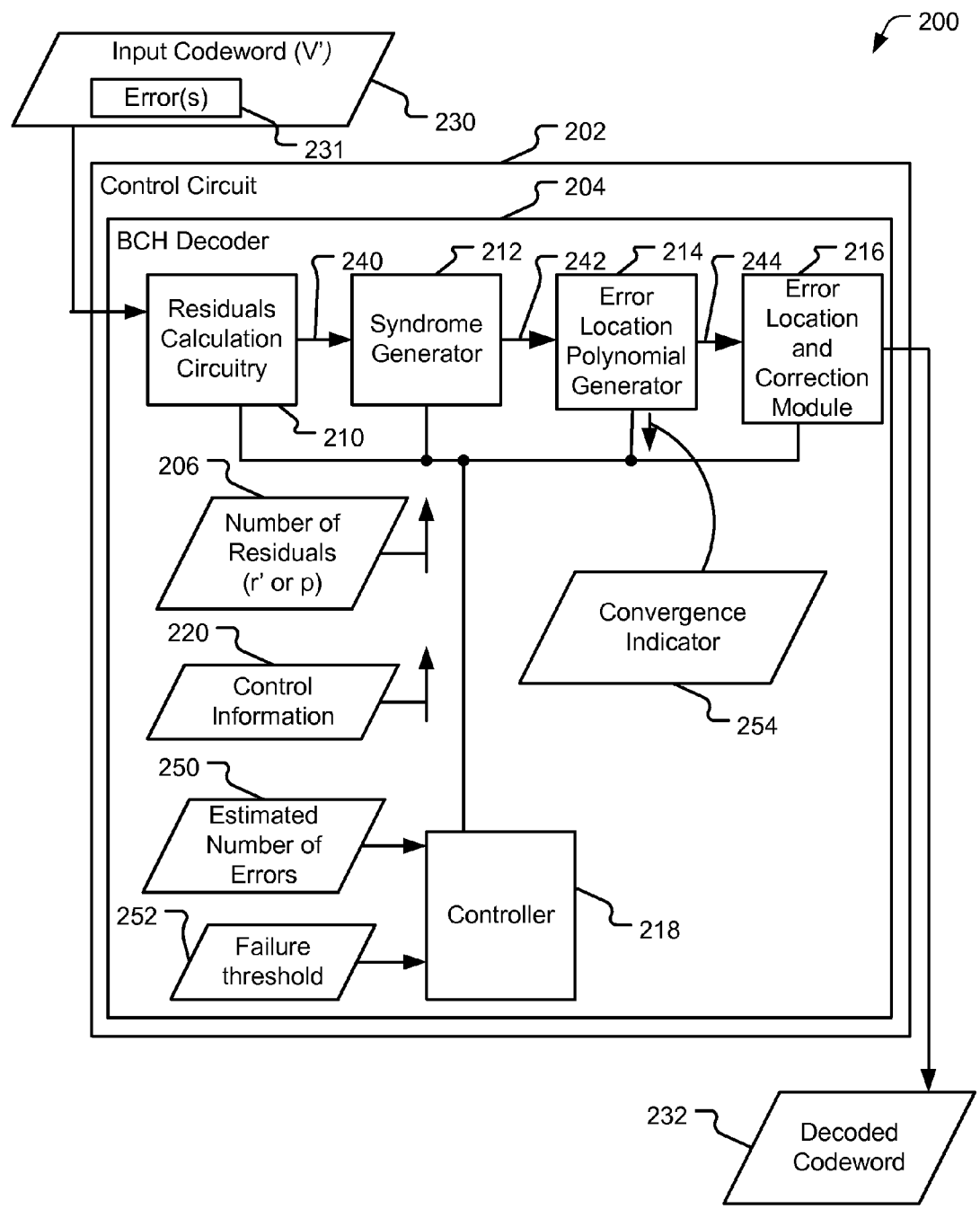
FIG. 2 is a block diagram of a second illustrative embodiment of a system that includes a BCH decoder that uses a reduced number of residuals.

Referring to FIG. 2, a particular illustrative embodiment of a control circuit 202 within a system 200 is illustrated. The control circuit 202 has an input to receive an input codeword 230 that contains one or more errors 231. The control circuit 202 has an output adapted to provide a decoded codeword 232. For example, the control circuit 202 may be used to implement the control circuit 112 of the memory device 102 in FIG. 1.

The control circuit 202 includes a BCH decoder 204. The BCH decoder 204 includes residuals calculation circuitry 210, a syndrome generator 212, an error location polynomial generator 214, and an error location and correction module 216. The BCH decoder 204 also includes a controller 218 that is coupled to control each of the circuits 210, 212, 214, and 216. The controller 218 receives or otherwise has access to an estimated number of errors 250 and a failure threshold 252. The controller 218 has an output to provide control information 220 that may be routed to one or more of the components 210, 212, 214, and 216, as shown in FIG. 2. The controller 218 also may communicate a selected number of residuals 206 to the residuals calculation circuitry 210. The selected number of residuals may comprise a first set of residuals (e.g., a partial set having (r') residual values) or a second number of residuals (e.g., a full set having (p) residual values).

During operation, the BCH decoder 204 receives the input codeword 230. The input codeword (V') 230 corresponds to an uncorrupted codeword (V) but also includes one or more errors 231, as shown in FIG. 2. Thus, the input codeword 230 may have one or more data elements that are corrupted. The residuals calculation circuitry 210 receives data representing the input codeword 230 having corrupted data. The residuals calculation circuitry 210 may include a plurality of division elements to perform residual calculations. For example, the residuals calculation circuitry 210 may include a plurality of divider blocks and each divider block includes circuitry to create a calculated residual value based on a polynomial division operation, as will be described with respect to FIG. 3. The residuals calculation circuitry 210 receives the selected number of residuals 220. In response to receiving the selected number of residuals 220, the residuals calculation circuitry 210 may enable all of the plurality of divider circuits or may enable a subset of the plurality of divider circuits. For example, in response to receiving a reduced number of residuals (e.g., r'), the residuals calculation circuitry 210 may disable a selected number of the divider circuits. By disabling or blocking operation of some of the divider circuits, the residuals calculation circuitry 210 may operate at a reduced power level.

The residuals calculation circuitry 210 provides an output 240 to the syndrome generator 212. In a particular embodiment, the residuals calculation circuitry 210 outputs a plurality of residual values 240. The syndrome generator 212 receives the plurality of residual values 240 and provides a set of syndromes 242. The set of syndromes 242 is sent to the error location polynomial generator 214. In a particular embodiment, the error location polynomial generator 214 may include circuitry designed to implement the Berlekamp method of error location polynomial generation. During operation, the error location polynomial generator 214 provides results 244 of the error location polynomials generated and provides a convergence indicator 254. The convergence indicator 254 identifies whether the error location polynomial generator 214 was able to reach convergence with a statistical likelihood that exceeds a predetermined threshold based on data received from the syndrome generator 212. When the convergence indicator 254 indicates that the error location polynomial generator 214 successfully converged, the output data 244 is provided to the error location and correction module 216 and successful decoding is achieved. In the event that the convergence indicator 254 identifies a non-convergence scenario, then the input codeword 230 received by the residuals calculation circuitry 210 could not be successfully decoded using the selected number of residuals 206.

When the error location polynomial generator 214 provides a positive convergence indication 254, the error location and correction module 216 receives data corresponding to the resulting error location polynomials 244 that is identified by the error location polynomial generator 214, such as data indicating the coefficients of the error location polynomials. The error location and correction module 216 identifies and corrects errors, such as by using a Chien search technique, and outputs the decoded codeword 232. Thus, the error location and correction module 216, in response to the error location polynomial generator 214, successfully corrects errors and provides the decoded codeword 232.

In the event that the convergence indicator 254 identifies a non-convergence, the controller 218 may initiate a subsequent decode operation. For the subsequent decode operation, the controller 218 sends the control information 220 and sends a requested number of residuals of the full set of residuals 206 to the residuals calculation circuitry 210. The full set of residuals may be identified by the value (p) within the selected number of residuals 206 or may be another value indicating that all polynomial division circuits are to be operative to generate residual values.

The residuals calculation circuitry 210 responds to receiving the number of residuals 206 (p) and enables all of the division elements (e.g., divider circuits) within the residuals calculation circuitry 210. Thus, the residuals calculation circuitry 210 does a full decode operation using all divider circuits. The residuals calculation circuitry 210 provides at its output a plurality of residual results from performing the residual calculations. The plurality of residual results 240 is provided to the syndrome generator 212. The syndrome generator 212 provides a full set of syndromes 242 corresponding to the full set of residuals 240. The error location polynomial generator 214 then attempts to generate an error location polynomial based on the full set of syndromes generated 242 and upon successfully converging may provide output data 244 indicating coefficients of the error location polynomial to the error location and correction module 216. In the event that the convergence indicator 254 identifies a positive convergence, the error location and correction module 216 solves (e.g., finds zeros of) the error location polynomial to locate and correct errors and generates the decoded codeword 232.

Thus, after performing residuals calculations at the residuals calculation circuitry 210 using all of the divider circuits within the residuals calculation circuitry 210 to generate the full set of residual values, the decoded codeword 232 may be generated by performing the subsequent decode operation. In the event that decoding with the full set of residuals does not achieve convergence, as indicated by the convergence indicator 254 during the subsequent decode operation, then the controller 218 receives a second notification of non-convergence. The controller 218, upon receiving the second notification of non-convergence, may identify a failure condition indicating the input codeword 230 was not able to be decoded.

The controller 218, responsive to the estimated number of errors 250 and responsive to the failure threshold 252, may selectively initiate either a full residuals calculation or a partial residuals calculation. For example, the controller 218 may send a full number of residuals (p) to the residuals calculation circuitry 210 via the number of residuals selection 206. Alternatively, to save power during the decode operation, the controller 218 may select a reduced number of residuals (r') 206 for use by the residuals calculation circuitry 210. In addition, the controller 218 is programmed to dynamically adapt to the convergence indicator 254 from the error location polynomial generator 214 in order to perform subsequent full decode operations in the event of failure of a partial residuals calculations that was previously performed. Thus, the controller 218 is able to dynamically adapt to the estimated number of errors 250 and the convergence indicator 254 to selectively request either a partial or a full residuals decode operation.

In a particular embodiment, the BCH decoder 204 may include further power savings capabilities. For example, the error location polynomial generator 214 may be implemented to include an early termination capability. The error location polynomial generator 214 may be able to terminate polynomial generation prior to fully completing the Berlekamp theoretical calculation method, as will be described with respect to FIGS. 5-6. For example, the error location polynomial generator 214 may include a termination circuit that is adapted to identify data patterns indicating a successful convergence. Upon determining that successful convergence is likely, the error location polynomial generator 214 may terminate the polynomial generation process prior to completion in order to further save power, conserve resources, and increase speed of decoding. Thus, the BCH decoder 204 includes circuit elements to adapt to input code words and to conserve power.

The BCH decoder 204 may be implemented to provide an error correction code (ECC) engine that comprises a plurality of residual calculation circuits. In at least one mode of operation, at least one residual calculation circuit within the residuals calculation circuitry 210 does not generate a residual value while other residual circuits within the residuals calculation circuitry 210 generate residual values. As an example, one or more residual calculation circuits may be selectively disabled while other residual values are generated by the residuals calculation circuitry 210. As another example, a clock signal may be blocked to one or more of the residual calculation circuits that is disabled, as will be described with respect to FIG. 3. Alternatively, all residual calculation circuits may remain enabled but one or more residual calculation circuits that are not selected to be used during decoding may be provided input data (e.g., an all-zeros or all-ones input) to reduce power consumption during operation of the circuit as compared to receiving codeword data as input.

In addition, the controller 218 may be adapted to determine a reduced number of errors (r) to be correctable at the BCH decoder 204 for performing error correction. The reduced number of errors (r) is less than a number of errors (t) that is correctable using the full set of (p) residual values. The controller 218 may determine the second number of residual values (r') based on the reduced number of errors (r). Thus, (r') may be calculated by the controller 218 in response to the estimated number of errors 250. In addition, the reduced number of errors (r) may be determined at least partially based on an estimated number of errors of the received data as indicated. The reduced number of errors (r) may also be determined at least partially based on the pre-determined failure threshold 252.

To illustrate, the controller 218 may determine an estimated number of errors expected to be present in the input codeword 230. For example, when the control circuit 202 is a flash controller, the expected average number of errors (q) may be determined by the flash controller according to various parameters, such as flash condition, number of write/erase cycles, previous block erase statistics and length of time for which data has been retained. Determining the expected average number of errors may be performed by various methods. The number of errors (q) may be provided to the decoder 204 as the estimated number of errors 250.

The decoder 204, which is capable of correcting (t) errors, targets its maximum decoding capability to (r) which is smaller than the maximum bit error correction capability of the code (t). The decoder 204 selects its current maximum correction capability (r) according to the inputted average number of errors (q) such that the probability of a decoding failure is smaller than a certain failure threshold value 252. For example, (r) would be greater than (q), but smaller than (t). As an illustrative, non-limiting example, when the failure threshold value is 0.01, (r) may be selected such that when the average error is (q), only 1 out of 100 codewords are expected to have more than (r) errors. A smallest number of residual values (r') sufficient to solve for (r) errors (e.g., (r') may be smaller than or equal to (r)) may be determined and indicated in the selected number of residuals 206. One or more other values of the failure threshold (e.g., 0.001, 0.05, etc.) may be used, and such value(s) may be selected, programmed, or computed at the decoder 204.

The second number of residual values (r') may be determined based on an iterative convergence scheme that terminates in response to a degree of an error location polynomial that equals or exceeds the first numbers of errors (t). In addition, or alternatively, the second number of residuals (r') may be determined based on an iterative convergence scheme that terminates in response to a predetermined number of sequential discrepancy factors equaling zero during the iterative convergence scheme prior to a degree of an error location polynomial equaling the first number of errors (t). Thus, the BCH decoder 204 includes control and processing circuitry to perform error correction and to selectively monitor and adapt to scenarios in order to conserve power consuming resources.

Figure 3:
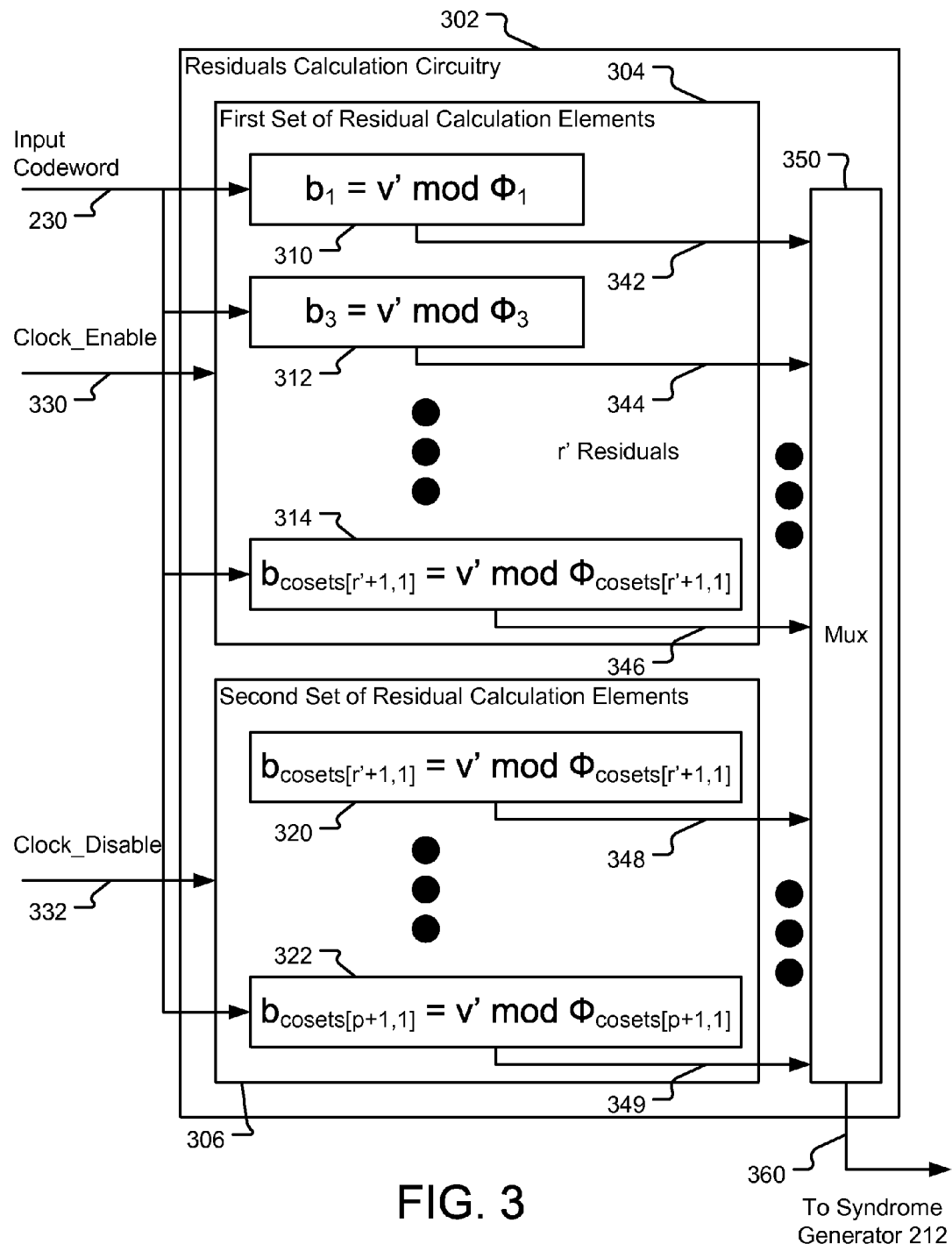
FIG. 3 is a block diagram of an illustrative embodiment of residuals calculation circuitry that may be used by a BCH decoder.

Referring to FIG. 3, a particular embodiment of residuals calculation circuitry 302 is shown. The residuals calculation circuitry 302 includes an input to receive an input codeword 230 and has an output 360. The output 360 is provided to a syndrome generator, such as the syndrome generator 212 of FIG. 2. The residuals calculation circuitry 302 includes inputs to receive a clock enable signal 330 and a clock disable signal 332.

The residuals calculation circuitry 302 includes a plurality of dividers (e.g., residual calculation elements, such as residual calculation circuits). For example, the residuals calculation circuitry 302 includes a first set of residual calculation elements 304 and a second set of residual calculation elements 306. The first set of residual calculation elements 304 includes a total of (r') residual calculation elements, illustrated as a representative first residual calculation circuit 310, a second residual calculation circuit 312, and a third (n'th) residual calculation circuit 314. The second set of residual calculation elements 306 includes a first residual calculation circuit 320 and an additional residual calculation circuit 322. As illustrated, the first set of residual calculation elements 304 is coupled to a clock enable signal 330 and the second set of residual calculation elements 306 is coupled to a clock disable signal 332. Thus, the residuals calculation circuitry 302 may correspond to a particular implementation of the residuals calculation circuitry 210 of FIG. 2 operating using a reduced set of (r') residual values.

During operation, the residuals calculation circuitry 302 receives the input codeword 230, which is routed to each of the residual calculation circuits within the first and second sets of residual calculation elements 304, 306. The clock enable signal 330 is provided to the first set of residual calculation elements 304. The clock disable signal 332 may be provided to the second set of residual calculation elements 306. In a partial residual mode of operation, each residual circuit 310, 312, 314 within the first set of residual calculation elements 304 is enabled by the clock enable 330. However, each of the residual circuits 320, 322 within the second set of residual calculation elements 306 is selectively disabled by the clock disable signal 332. Thus, the second set of residual calculation elements 306 is selectively disabled or blocked from operating while the first set of residual calculation elements 304 remain active and operable to provide residual calculation results.

For example, the first set of residual calculation elements 304 provides representative residual results 342, 344, 346. Each of the residual results (e.g., $b_1$ 342, $b_3$ 344, $b_{cosets[r'+1,1]}$ 346) is provided to the multiplexer 350 and represents the received data (V') (i.e., the input codeword 230) divided by a corresponding BCH minimal polynomial (e.g., $\Phi(1)$, $\Phi(3)$, etc.) according to a polynomial division operation over a Galois finite field. Similarly, the outputs of the second set of residual calculation circuits 306, where the outputs by 348, 349, are provided to the multiplexer 350. The multiplexer 350 selectively provides one or more of the residual results as output 360 that is provided to the syndrome generator 212. In a full residual mode of operation, each of the residual circuits within the first set of residual calculation elements 304 and the second set of residual calculation elements 306 is enabled and is operative to perform residual calculations. Thus, in the full residual mode of operation, all of the residual circuit results 342, 344, 346, 348, 349 are provided to the multiplexer 350 for subsequent output via the output 360. Accordingly, the residuals calculation circuit 302 has a partial residual mode of operation to save power and has a full residual mode of operation to provide enhanced decoding using all residual circuit elements.

As illustrated in FIG. 3, only (r') residuals are calculated out of a maximum of (p) residuals by clock enabling only the first (r') residual circuits (e.g., the first set of residual calculation elements 304). The rest of (p-r') residual circuits are disabled (e.g., the second set of residual calculation elements 306). The power consumption is reduced because during this first stage of decoding, only (r') division circuits are active.

Figure 4:
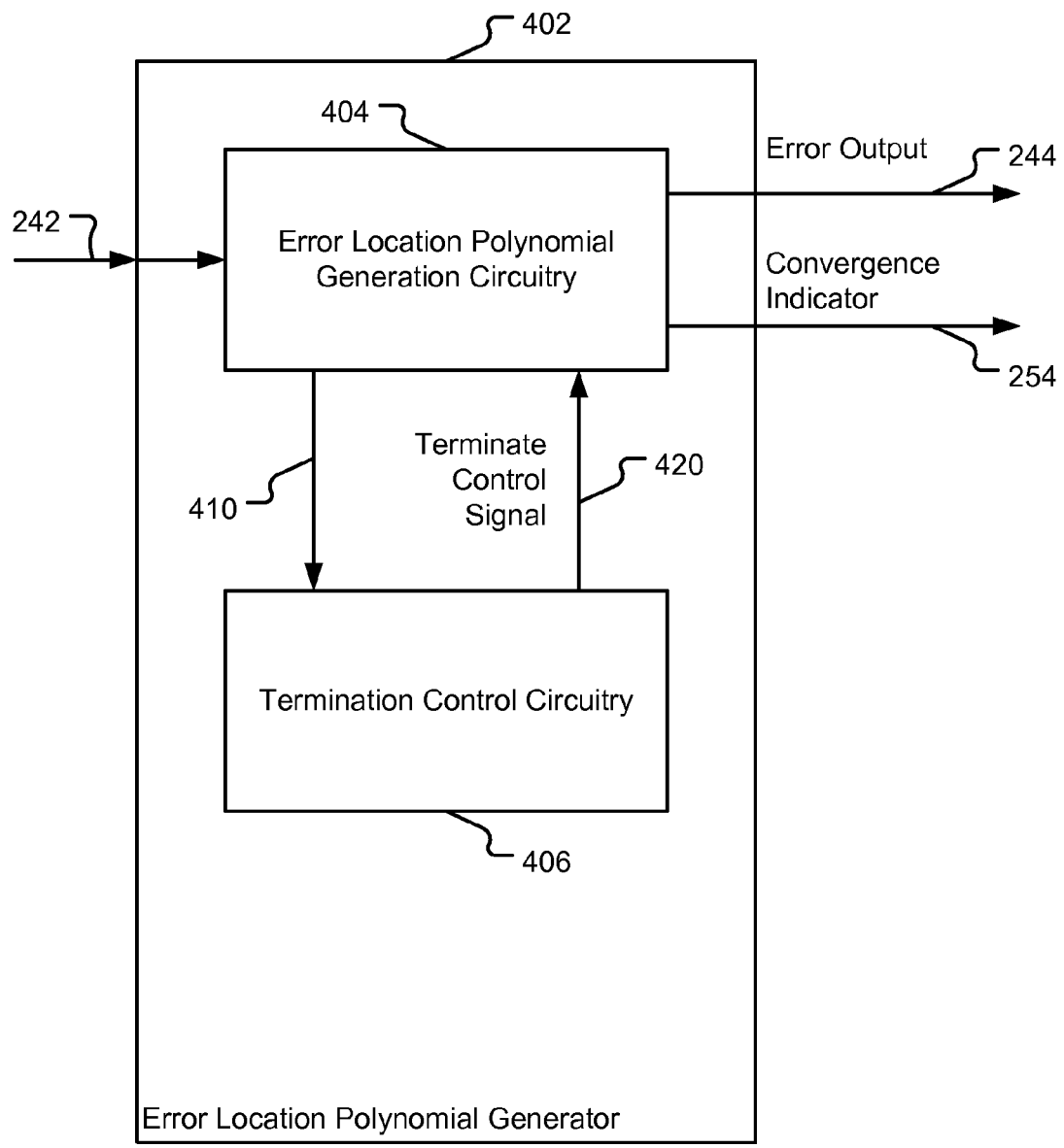
FIG. 4 is a block diagram of an illustrative embodiment of an error location polynomial generator that may be used by a BCH decoder.

FIG. 4 depicts a system 400 that includes an error location polynomial generator 402 that includes error location polynomial generation circuitry 404 coupled to termination control circuitry 406. The error location polynomial generator 402 has an input to receive syndrome data 242 and is configured to provide an error output 244 corresponding to an error location polynomial and a convergence indicator 254. The error location polynomial generator 402 may be implemented as the error location polynomial generator 214 in the BCH decoder 204 of FIG. 2.

The error location polynomial generation circuitry 404 may be configured to implement an iterative convergence scheme, such as a Berlekamp-Massey method, to generate an error location polynomial. Each particular iteration of the iterative convergence scheme includes updating an error location polynomial and determining a discrepancy factor corresponding to the particular iteration, as described with respect to FIG. 6. The error location polynomial generation circuitry 404 may be configured to provide updated iteration data 410 to the termination control circuitry 406 at each iteration. The error location polynomial generation circuitry 404 may also be responsive to a terminate control signal 420 from the termination control circuitry 406 to terminate the iterative convergence scheme.

The termination control circuitry 406 is responsive to the updated iteration data 410 to determine whether the iterative convergence scheme is to be terminated. For example, as described with respect to FIG. 5, the termination control circuitry 406 may implement decision logic to terminate the convergence scheme when a theoretical maximum error correction capability has been reached. In addition, the termination control circuitry 406 is configured to use statistical criteria to enable a termination of the iterative convergence scheme prior to the theoretical capability being reached (e.g., absolute convergence). For example, in response to multiple cycles of updated iteration data 410 indicating a convergence has occurred with a statistical likelihood that exceeds a predetermined threshold, the termination control circuitry 406 may instruct the error location polynomial generation circuitry 404 to halt and to generate the error output 244 and/or the convergence indicator 254.

By halting the iterative convergence scheme when convergence is statistically likely (i.e., above a predetermined threshold) but not yet certain, an amount of time required and an amount of power consumed to determine an error location polynomial may be significantly reduced.

Figure 5:
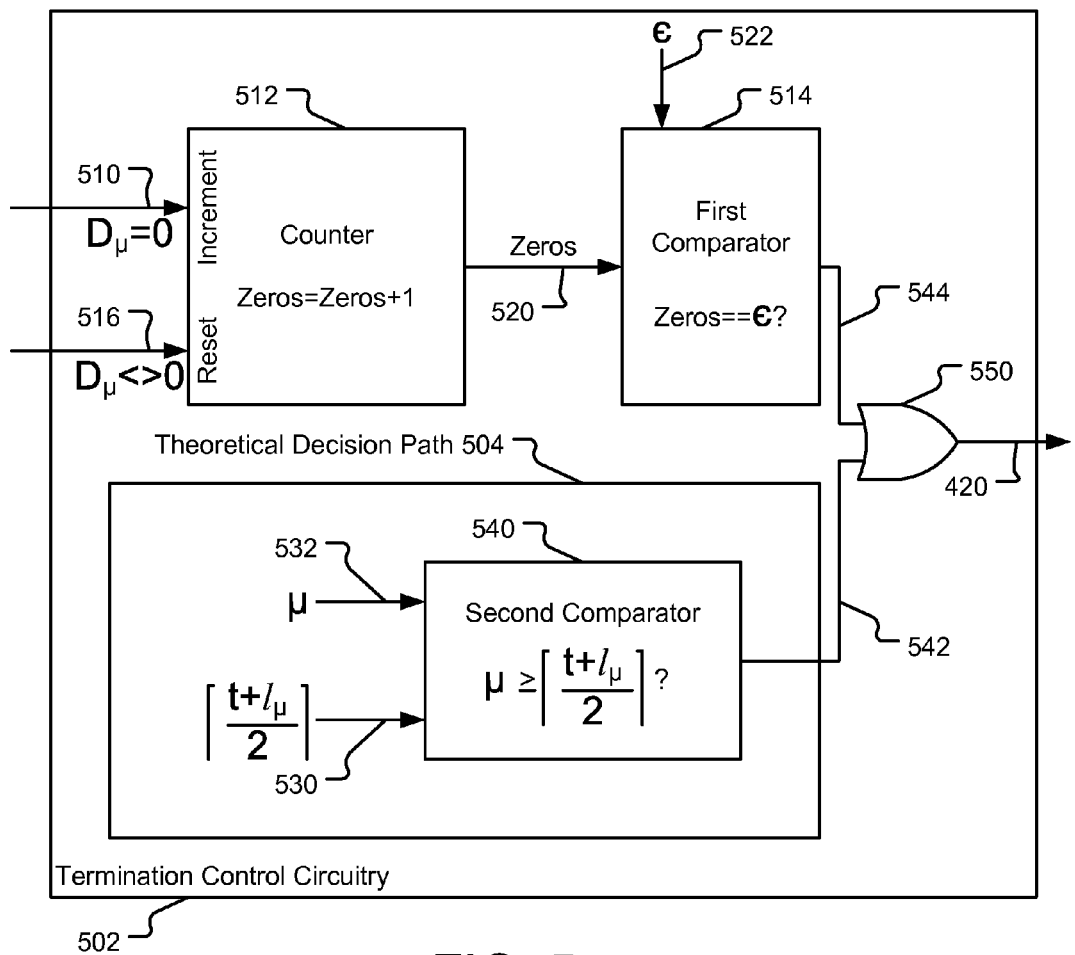
FIG. 5 is a block diagram of an illustrative embodiment of termination control circuitry that may be used by a BCH decoder.

Referring to FIG. 5, a particular illustrative embodiment of a system 500 that includes termination control circuitry 502 configured to send a terminate control signal 420 to halt a Berlekamp-Massey iterative procedure based on satisfying statistical criteria is illustrated. The termination control circuitry 502 may be used as the termination control circuitry 406 of FIG. 4.

The termination control circuitry 502 includes a statistical decision path that includes a counter 512 coupled to a first comparator 514. The termination control circuitry 502 also includes a theoretical decision path 504 that includes a second comparator 540. An OR logic element 550 generates the terminate control signal 420 based on inputs from the statistical decision path and the theoretical decision path 504.

The comparator 540 of the theoretical decision path 504 receives a first input ($\mu$) 532 that indicates an iteration number of the iterative convergence scheme. The second comparator 540 also receives an input 530 that has a value determined by floor$((t+l_\mu)/2)$, where floor(x) is a function that evaluates as the largest integer not exceeding (x), (t) is a largest number of errors correctable by the ECC scheme, and ($l_\mu$) is a largest power of the iteratively updated error location polynomial at the $\mu$th iteration. The second comparator 540 is configured to send a termination signal via an output 542 when ($\mu$)$\geq$floor$((t+l_\mu)/2)$.

The counter 512 is responsive to a discrepancy factor ($D_\mu$) corresponding to each iteration, ($\mu$), that may be received via iteration update data 510. The counter 512 is set to a zero value when an iterative convergence scheme is started. When ($D_\mu$) is equal to zero during a particular iteration, the counter value is incremented. When ($D_\mu$) is not equal to zero, at 513, the counter value is reset to zero. As a result, after each iteration of ($\mu$) a zeros count 520 is provided to the comparator 514. The zeros count 520 indicates how many consecutive iterations the discrepancy factor ($D_\mu$) has equaled zero.

The comparator 514 is configured to receive the zeros count 520 and a statistical threshold value ($\epsilon$), at 522. The statistical threshold value ($\epsilon$), at 522 may indicate a predetermined number of iterations that may be compared to the zeros count 520. When the zeros count 520 equals the threshold value 522, the comparator 514 provides a terminate signal via an output 544.

During each iteration, the discrepancy factor ($D_\mu$) for the iteration is determined. The zeros counter 520 is incremented in response to the discrepancy factor ($D_\mu$) being zero. The zeros counter 520 is reset in response to the discrepancy factor ($D_\mu$) being non-zero. A value of the zeros counter 520 is also compared to a predetermined number of sequential discrepancy factors to generate the output 544.

Either output 542, 544 may trigger the termination control signal 420 to halt the iterative convergence scheme. When the second comparator 540 triggers the termination control signal 420, no additional errors can be corrected and so the convergence process can be stopped. However, when the first output 544 triggers the termination control signal 420, convergence is determined to have occurred with an acceptable confidence level, and the iterative convergence scheme is terminated prior to a degree of the error location polynomial equaling the maximum number of errors (i.e., prior to absolute convergence).

FIG. 6 depicts tables corresponding to a particular example of updated iteration data of a convergence scheme and termination according to the statistical decision path and the theoretical decision path of FIG. 5. A first table 602 illustrates data generated by a Berlekamp-Massey procedure that fills up a table and each iteration fills the $(\mu+1)$th row as follows:

1. If $(D_\mu)=0$, then $\sigma^{\mu+1}(X)=(X)$. $\sigma(X)$ at iteration $(\mu+1)$ remains the same as at iteration $(\mu)$.

2. If $(D_\mu)\neq 0$, find another row, $\rho$ preceding the $\mu$th row such that the value $(2\mu-1\mu)$ in the last column is maximum and also such that $D_\rho \neq 0$. Then: $\sigma^{\mu+1}(X)=\sigma^\mu(X)+D_\mu D_\rho^{-1} X^{2(\mu-\rho)} \sigma^\rho(X)$ is calculated from previous $\sigma(X)$ at iteration $(\mu)$ $\sigma(X)$ at iteration $(\rho)$, $D_\mu$ and the multiplicative inverse of $D_\rho$. In both cases, $1_{\mu+1}$ is exactly the degree of $\sigma^{\mu+1}(X)$, and the discrepancy at the $(\mu+1)$th step is:

$$D_{\mu+1}=D_{2\mu+3}+\sigma_1^{(\mu+1)}S_{2\mu+2}+\sigma_2^{(\mu+1)}S_{2\mu+1}+\ldots+\sigma_{1\mu+1}^{(\mu+1)}S_{2\mu+3-1\mu+1}$$

Floor $((t+v)/2)$ iterations are required for evaluation of the error location polynomial, where (t) is the maximum number of correctable errors and (v) is the number of errors that occurred.

If the desired error location polynomial is calculated after (v) iterations then floor$((t+v)/2)-(v)$ additional iterations are required to verify absolutely that there are only (v) errors. In this case, at each of the extra iterations the value of the next discrepancy factor $D\mu_{+1}$ will be zero.

The first table 602 illustrates an example for BCH(255, 124, 2*18+1), generator polynomial for the GF($2^8$) finite field is the default polynomial $1+X^2+X^3+X^4+X^8$. The code can correct up to 18 bits. Errors are inserted in bit positions 0, 1 and 2.

The 35 syndromes which are calculated prior to the Berlekamp procedure are: $\beta^{195}, \beta^{135}, \beta^{143}, \beta^{15}, \beta^{135}, \beta^{31}, \beta^{132}, \beta^{30}, \beta^{212}, \beta^{15}, \beta^{247}, \beta^{62}, \beta^{223}, \beta^9, \beta^{208}, \beta^{60}, \beta^{119}, \beta^{169}, \beta^{189}, \beta^{30}, \beta^{237}, \beta^{239}, \beta^{120}, \beta^{124}, \beta^{123}, \beta^{191}, \beta^{230}, \beta^{18}, \beta^{154}, \beta^{161}, \beta^{20}, \beta^{120}, \beta^{154}, \beta^{238}, \beta^{111}$.

From table 1 602 it is shown that the location polynomial, $(\sigma^\mu(X))$, converges after only 3 iterations but iterations 4 to 11 are required to verify absolutely that no additional terms will be generated. During iterations 3 to 10, the next estimation for the location polynomial, $(\sigma^{\mu+1}(X))$, remains the same at iterations 4 to 11. In this example, the convergence process can be stopped when $X^{2(\mu-\rho)}\sigma^\rho(X)$ reaches a degree of 18 because the code cannot correct more than 18 bit errors.

In contrast, table 2 604 illustrates the error location polynomial calculated as in table 1 602 by (v) iterations but the verification that there are no more than (v) errors is not done in an absolute manner but rather to a degree of confidence level. When used with data read from a flash memory associated with a Block Error Rate (BLER), the degree of confidence level may be determined to be a much higher confidence than the maximum allowed BLER (Block Error Rate) of the flash memory. The decoding procedure can be terminated when $(D_{\mu+1})$ equals 0 for $(\epsilon)$ subsequent iterations. For example, the convergence procedure may be stopped after three successive zeroes $(\epsilon)$ of $(D_{\mu+1})$.

Table 2 604 shows that the Berlekamp-Massey convergence procedure is stopped according to the required confidence level. Assuming that the values of $(D_{\mu+1})$ are uniformly distributed from 0 to 255, then at iteration 3, the probability that $(D_{\mu+1})$ will reach 0 only as a result of an intermediate step that will yield a location polynomial with a maximum degree which is higher then 3 is $1/256$. At iteration 4 this probability will reduce to $1/256^2$. If the required BLER is smaller then $10^{-7}$, then the convergence procedure can be stopped after only 3 successive zeros of $(D_{\mu+1})$. Thus, the location polynomial is evaluated by 5 iterations instead of 11 iterations of the theoretical decision path 504 of FIG. 5.

In accordance with FIGS. 5-6, the predetermined number of sequential discrepancy factors may be determined at least partially based on the block error rate (BLER) threshold. A probability that the iterative convergence scheme terminates prior to determining an actual convergence value of the error location polynomial may be less than the block error rate threshold. As a result, improvement in speed and reduction in power may be obtained while maintaining a high degree of confidence in the accuracy of decoding.

BCH decoding procedures in accordance with the present disclosure may therefore be described by:

1. Determine (q) (an expected average number of errors), and select (r) based on (q) so that an estimated probability of decoding failures using (r) is smaller than a certain threshold value.

2. Calculate (r') residuals based on the expected average number of errors (q), disabling calculation of the other (p-r') residuals, e.g., by clock disabling certain division circuits.

3. Evaluate syndromes from the (r') residuals, e.g., using only $2(r+\epsilon)$ when early termination according to FIGS. 5-6 is implemented.

4. Evaluate an error location polynomial using the Berlekamp-Massey algorithm with statistical termination conditions according to the early termination of FIGS. 5-6. Alternatively, conventional termination may be used instead of the early termination of the present disclosure. However, using early termination promotes a synergistic saving of time and power. Using early termination, fewer syndrome residual components need to be supplied, and fewer residuals need to be calculated in (1), above. That is, (r') is smaller if early termination is used rather than conventional termination.

If there are no more than (r) errors, then decoding is successful and processing proceeds to the Chien search procedure. If there are more than (r) errors, then a decoding failure at first trial may be reported and decoding is performed again using the maximum ECC capabilities (i.e., ECC for (t) errors). Decoding a second time using the maximum ECC capabilities may occur in a small number of cases, (e.g., one out of a thousand).

5. Search for errors using a Chien search circuit.

It will be understood that after completion of decoding, the retrieved data is corrected using the results of the error detecting and locating process. Correction of data involves selectively erasing and writing data, as dictated by the error detection and error location results. Erasing and writing of data involves adding or removing electrons from the affected memory cells, thereby changing the voltage of the cells and hence the value (e.g., zero or one) of the data held in the cells (a given threshold voltage range of the cell representing a given value of data stored by the cell). The results of the algorithmic portion of the error correction scheme are physically applied or implemented on the retrieved data, i.e., on the memory cells storing the retrieved data, by means of physical transformations of the electrical properties (e.g., movement of the electrons) of the cells. An apparatus such as a charge pump may be used to effect the physical changes of the memory cells.

The disclosed apparatus and method reduces the power consumption in the first and second stages of BCH decoding (e.g., the residuals calculation circuitry 210 and the syndrome generator 212 of FIG. 2). Fewer than the maximum number of minimal polynomial residuals are calculated, and the number of residuals calculated is determined as a function of the expected average number of errors. When a condition of a flash memory device is good or much better than its end of life condition, a substantial part of the decoding circuit may be disabled, reducing the overall decoding power consumption significantly.

For example, in a BCH decoder that can handle 122 errors, the ECC can handle a maximum bit error rate (BER) of 0.34% over two kilobytes (2 Kb) of data assuming that the output BLER (block error rate) does not exceed 10^(−11). The system may be designed such the average number of errors under worst case conditions is 62, but suppose that the flash controller has information that the average number of errors, (q), is 30, which is equivalent to a BER of 0.17%. If a threshold decoding failure probability of 0.001 is chosen for a first decoding trial, then it is possible to code only for a maximum of (r) equals 49 errors, instead of (r) equals 122 errors. An advantage is that in the first stage of BCH decoding, (r') equals 52 (3 extra residuals are required to stop the Berlekamp procedure according to statistical termination condition). The method calculates 52 residuals instead of 122 residuals and 70 of the residual division circuits can be disabled. Also, 104 syndromes out of a maximum of 244 syndromes are calculated during the second stage of decoding, further reducing power. In this example, over the entire decoding process, the total power consumption of the decoder is decreased by about 36%.

Figure 7:
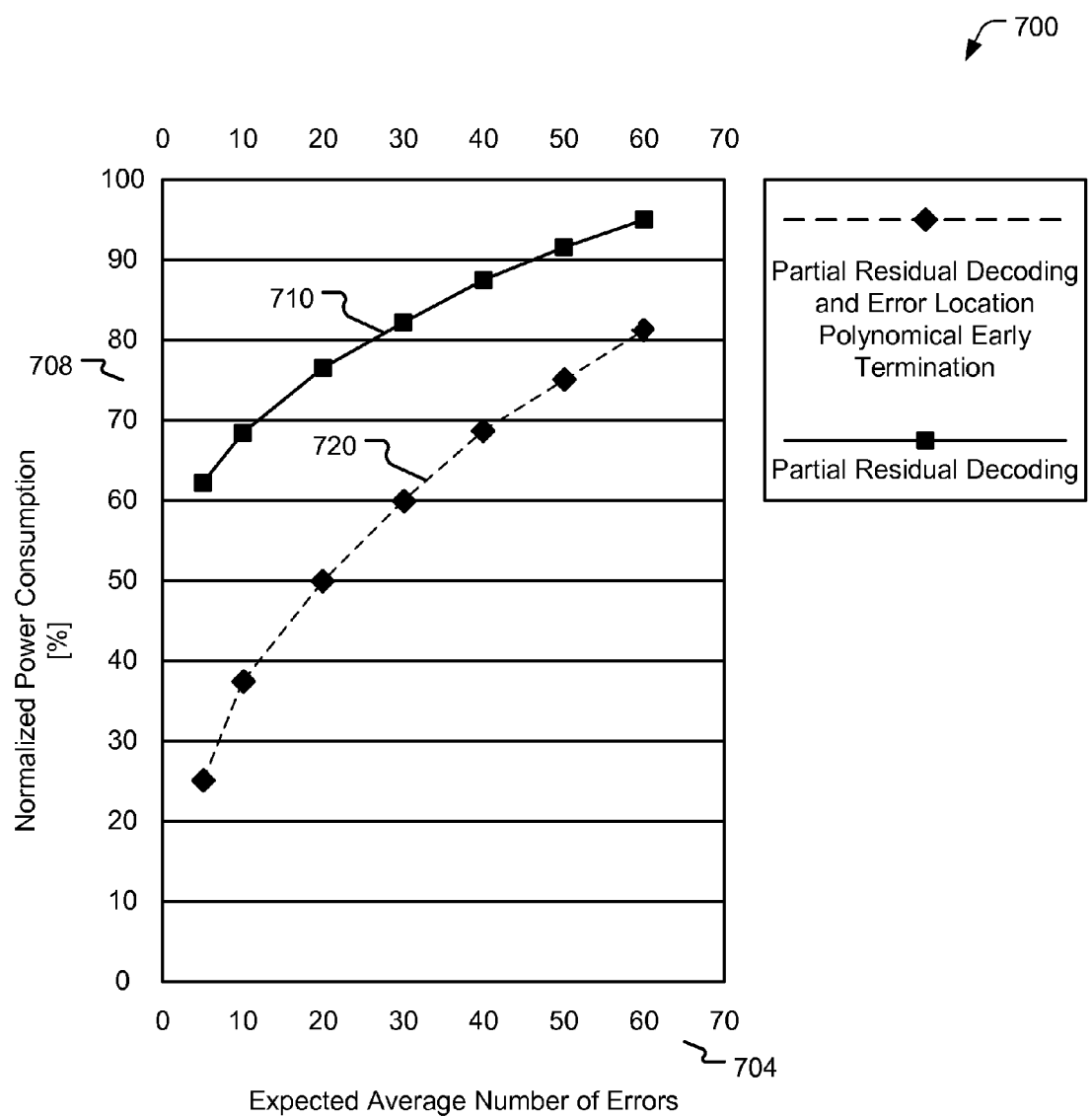
FIG. 7 is an illustration of a graph that shows the normalized power consumption of a memory device relative to an expected average number of errors using partial residual decoding and error location polynomial generator early termination.

The above example of (q) equals 30 errors and a power of consumption reduction of 36% is just one example. Referring to FIG. 7, the reduction in power consumption may range from over 60% to about 10%, depending on the expected number of errors, which depends on the conditions of the flash memory and, for multi level-flash devices, the cell error rate relative to the bit error rate.

FIG. 7 shows an example 700 of a decrease of consumed power 708 as a function of the expected number of errors 704 in a 122 bit BCH decoder where the average number of errors at the flash end of life is 62 errors. Even at an end of life condition, the method can reduce the decoder power consumption. The solid line curve 710 shows the reduction of power consumption as a function of the average number or errors according to a reduced residual technique of FIGS. 1-3 and using conventional error location polynomial termination, while the dash line curve 720 shows the reduction of power consumption when the reduced residual computation of FIGS. 1-3 is implemented in synergistic combination with the error location polynomial generation statistical (early) termination.

Figure 8:
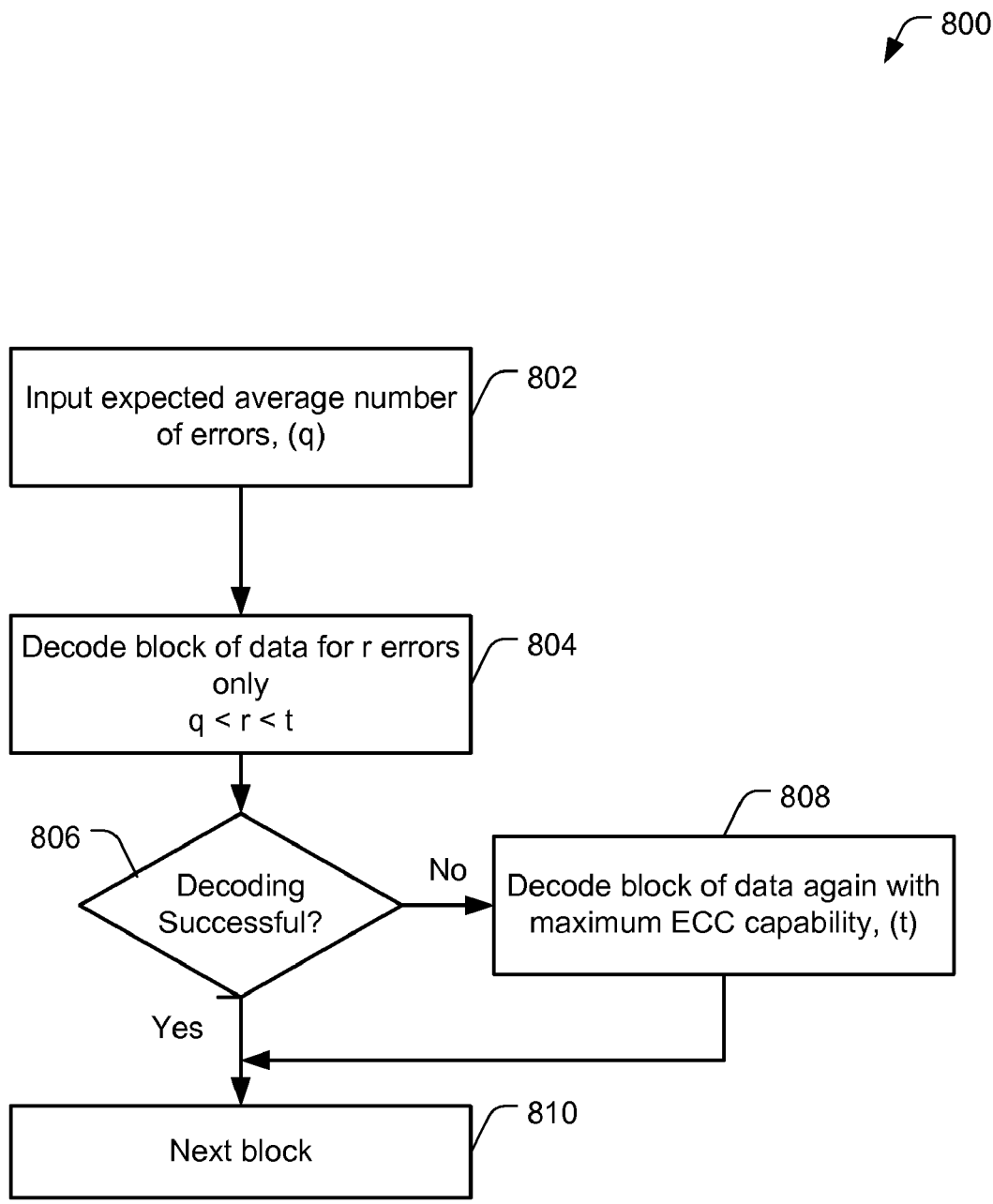
FIG. 8 is a flow chart of an embodiment of a method of decoding with less than a maximum capability of an ECC.

FIG. 8 depicts an illustrative embodiment of a method 800 of decoding a block of data with less than a maximum capability of an ECC. The method 800 may be performed by the decoder 114 of FIG. 1 or the BCH decoder 204 of FIG. 2, as illustrative, non-limiting examples. The expected average number of errors, (q), is input at a decoder, at 802. For example, the expected average number of errors may be determined by a flash controller according to various parameters, such as flash condition, number of write/erase cycles, previous block erase statistics, and length of time for which data has been retained.

The decoder, which is capable of correcting (t) errors, targets its maximum decoding capability to (r) which is smaller than the maximum bit error correction capability of the code (t) and decodes the block for (r) errors, at 804. The decoder may select its current maximum correction capability (r) according to the input average number of errors (q), such that the probability of a decoding failure is smaller than a certain threshold value. The number of errors (r) is greater than (q) but smaller than (t).

At 806, a determination is made whether the decoding is successful. When the decoding is determined to be successful, processing continues to a next block, at 810. When the decoding is determined to not be successful, the data is decoded again using the maximum ECC capacity of the decoder, e.g., to correct (t) errors, at 808.

Figure 9:
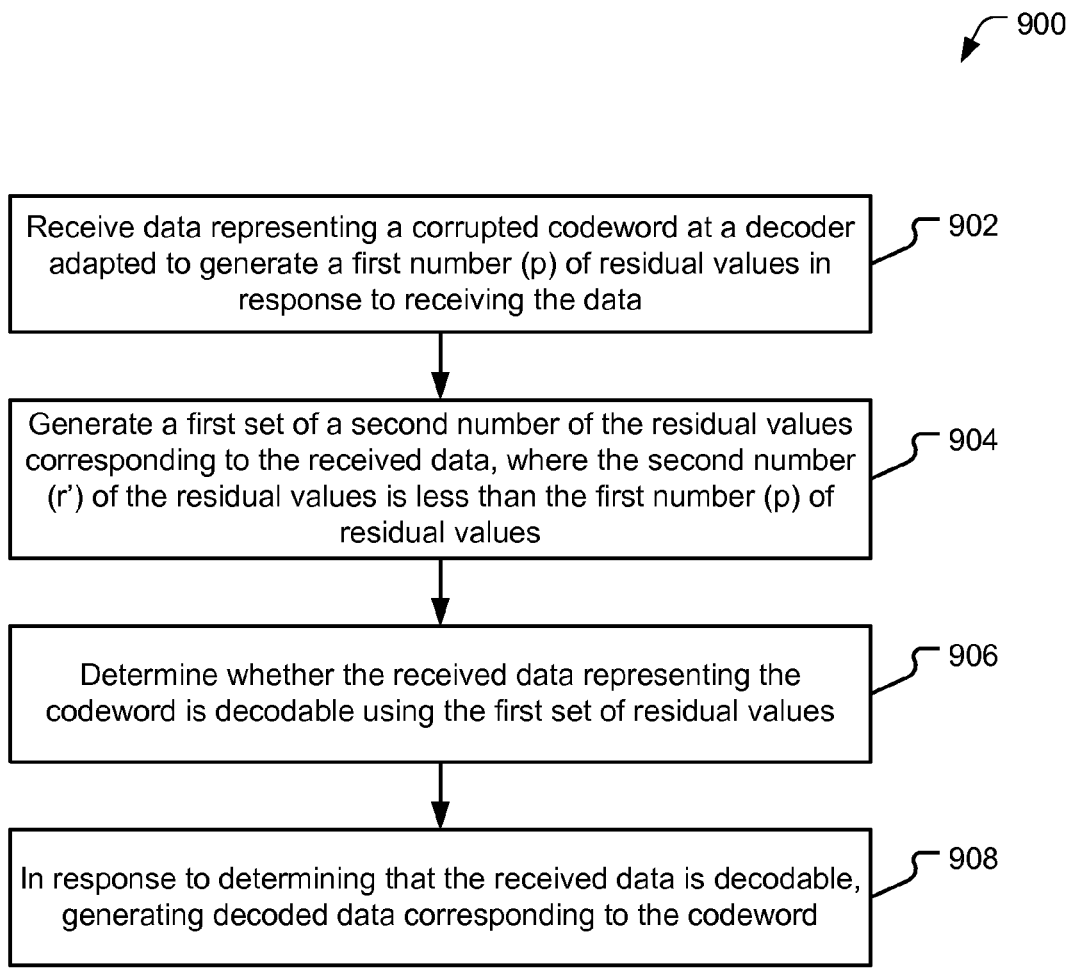
FIG. 9 is a flow chart of a first illustrative embodiment of a method of operating a decoder using a reduced number of residuals.

Referring to FIG. 9, a particular illustrative embodiment of a method of decoding data is shown. The method may be performed at a decoder configured to generate multiple residual values to correct errors within a codeword that has been corrupted. For example, the method may be performed within the decoder 114 of FIG. 1 or the BCH decoder 204 of FIG. 2. The decoder is adapted to generate a first number of residual values in response to receiving data representing the corrupted codeword. For example, the decoder 204 is adapted to generate a first number of residual values (p) in response to receiving the codeword data 230 of FIG. 2.

The method includes receiving the data representing the corrupted codeword, at 902. The method further includes generating a first set of a second number of the residual values corresponding to received data, at 904. The second number of the residual values is less than the first number of the residual values. For example, the second number of residual values may be the value (r') determined by the controller 218 of FIG. 2. The value (r') is less than the first number of residual values (p).

The method further includes determining whether the received data representing the corrupted codeword is decodable using the first set of residual values, at 906. For example, in FIG. 2, the codeword 230 may be identified as decodable by receiving a positive convergence indication 254. The method further includes, in response to determining that the received data is decodable using the first set of residual values, generating decoded data corresponding to the codeword, at 908. The decoded data is generated using the first set of residual values. For example, the first set of residual values associated with the second number (r') of residual values may be used by the residuals calculation circuitry 302 of FIG. 3. By using the second number of residual values (r') instead of the first number of residual values (p), the residuals calculation circuitry may enable some but not all of the residual circuits contained therein. For example, the first set of residual circuits 304 of FIG. 3 may be enabled while the second set of residual circuits 306 of FIG. 3 is disabled. By disabling some of the residual circuits, power is conserved.

Figure 10:
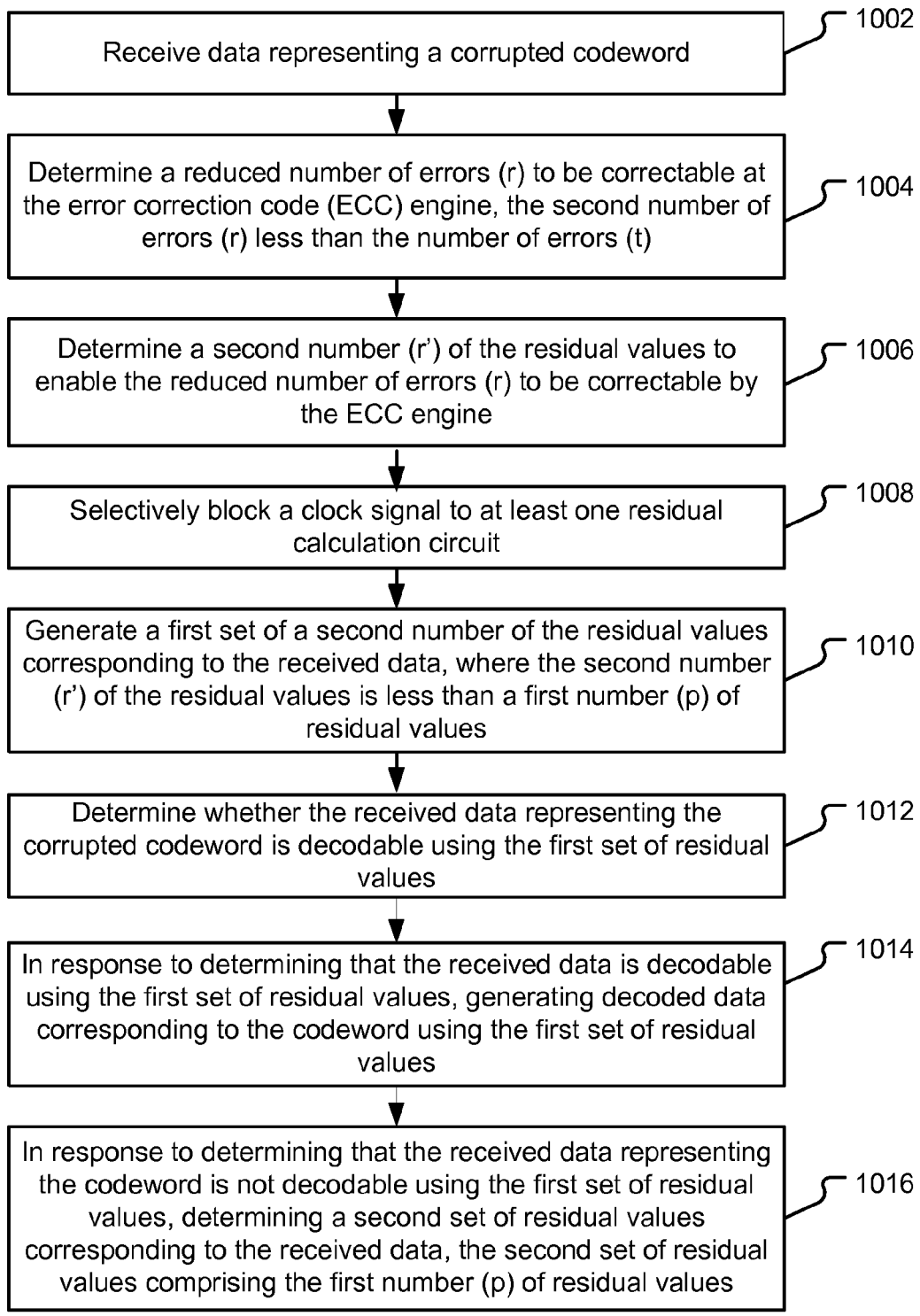
FIG. 10 is a flow chart of a second illustrative embodiment of a method of operating a decoder using a reduced number of residuals.

Referring to FIG. 10, further details of a particular illustrative embodiment of a method of decoding data is shown. The method may be performed at a decoder that is configured to generate multiple residual values to correct errors within a codeword. For example, the decoder 204 may generate multiple residual values 240 to correct errors 231 within the codeword 230. The decoder is adapted to generate a first number residual values in response to receiving data representing the corrupted codeword.

Referring to FIG. 10, the method includes receiving data representing a codeword, at 1002. A reduced number of errors (r) may be determined to be correctable at a decoder used to perform error correction, at 1004. An error correction code (ECC) engine may be implemented at a decoder, such as the decoder 204 of FIG. 2. The reduced number of errors (r) is less than the first number of errors (t).

A second number (r') of residual values may be determined based on the reduced number of errors (r), at 1006. The reduced number of errors may be determined at least partially based on an estimated number of errors of the received data. The reduced number of errors may also be determined at least partially based on a predetermined failure threshold. For example, the controller 218 of FIG. 2 may receive an estimated number of errors 250 and the predetermined failure threshold 252 and may use such values to determine whether to send the selected number of residual values (r') or the full number of residual values (p) to the residuals calculation circuitry 210. The second number (r') of the residual values may be determined based on an iterative convergence scheme that terminates in response to a degree of an error location polynomial equaling or exceeding the first number of errors (t), such as a conventional termination condition for the Berlekamp method of generating an error location polynomial. Alternatively, the second number (r') of residual values may be determined based on an iterative convergence scheme that terminates in response to a predetermined number of sequential discrepancy factors equaling zero during an iterative convergent scheme prior to a degree of an error location polynomial equaling the first number of errors (t), such as described with respect to FIGS. 4-6.

The method may include selectively blocking a clock signal to one or more residual calculation circuits, at 1008. For example, the set of residual calculation elements 306 of FIG. 3 may be selectively blocked by applying the clock disable signal 332.

A first set of a second number of residual values is generated corresponding to received data, at 1010. The second number of the residual values is less than the first number of residual values. The method further includes determining whether the received data representing the codeword is decodable using the first set of residual values, at 1012. In response to determining that the received data is decodable using the first set of residual values, the method generates decoded data corresponding to the codeword, at 1014. In response to determining that the received data is not decodable using the first set of residual values, the method determines a second set of the residual values corresponding to the received data, at 1016. The second set of residual values may comprise the first number (p) of the residual values. Thus, a full residual decode operation may be performed after determining that a decode operation using a partial set of residual values is not decodable.

The received data may be read from a flash memory having a block error rate threshold. For example, the pre-determined number of sequential discrepancy factors may be determined at least partially based on the block error rate threshold. Thus, the method of decoding data may be used in connection with a flash memory array having a block error rate threshold.

Figure 11:
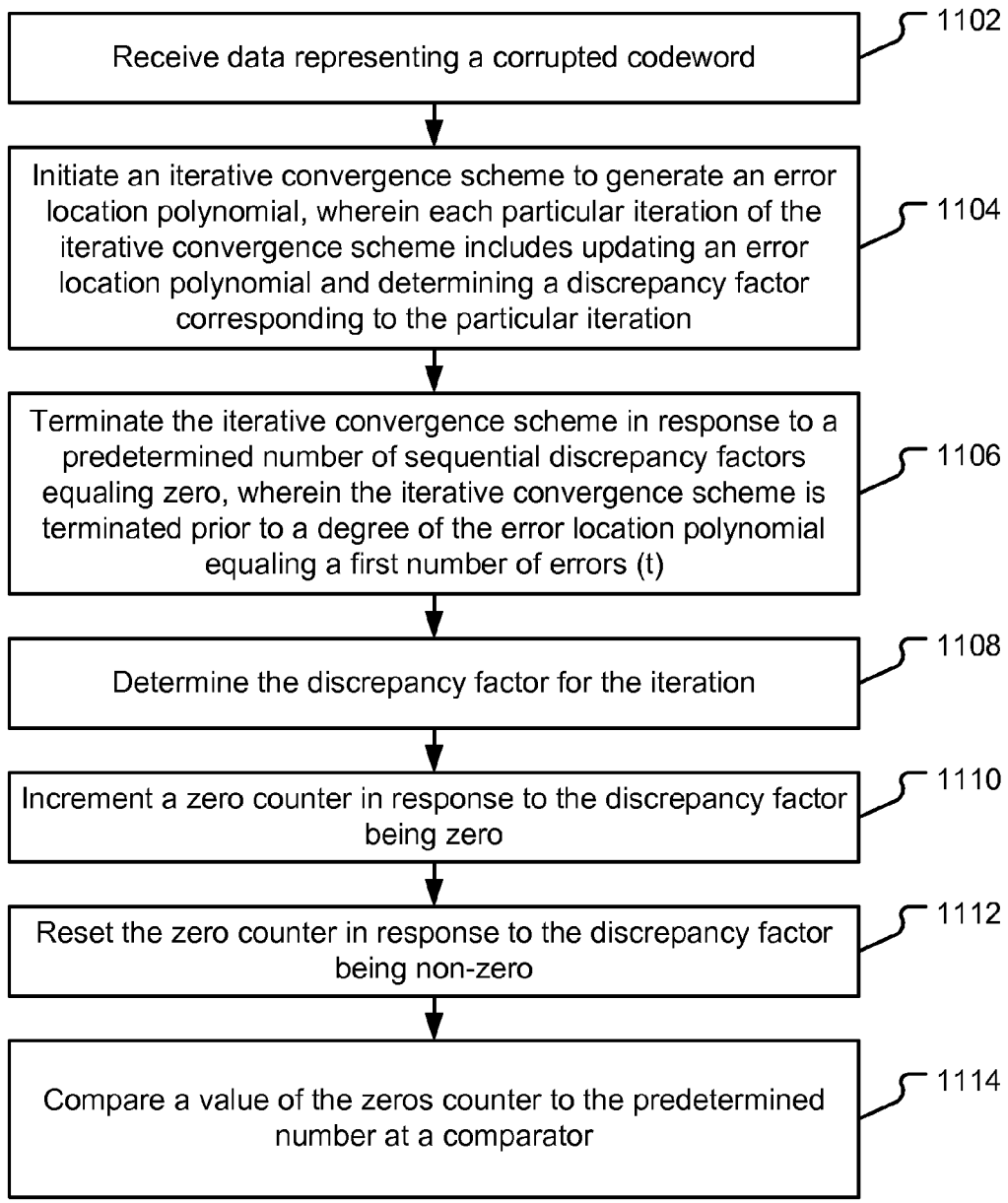
FIG. 11 is a flow chart of an illustrative embodiment of a method of operating a decoder that includes an error location polynomial generator.

Referring to FIG. 11, a particular illustrative embodiment of a method of decoding data is shown. The method may be used at a decoder configured to generate and correct a first number of errors (t) within a codeword. For example, the method may be performed by a decoder, such as the decoder 204 of FIG. 2 that uses the error location polynomial generator 402 of FIG. 4. The method includes receiving data representing the codeword, at 1102. The method further includes initiating an iterative convergence scheme to generate an error location polynomial, at 1104. Each particular iteration of the iterative convergence scheme includes updating an error location polynomial and determining a discrepancy factor corresponding to the particular iteration. The method further includes terminating the iterative convergence scheme in response to a predetermined number of determined sequential discrepancy factors equaling zero, at 1106. The iterative convergence scheme is terminated prior to a degree of the error location polynomial equaling the first number of errors, as described with respect to FIGS. 5-6.

In a particular example, table 602 of FIG. 6 shows conventional termination criteria and table 604 of FIG. 6 illustrates iterative termination after ($D_{\mu+1}$) equals zero for three consecutive iterations. Fewer iterations indicates faster decoding and can be used for hard drive replacements with flash memories having high speed requirements. The data representing the corrupted codeword may be read from a flash memory array. A block error rate threshold may correspond to the flash memory array, and the predetermined number of sequential discrepancy factors may be determined at least partially based on the block error rate threshold. In addition, a probability that the iterative convergence scheme terminates prior to determining an actual convergence value of the error location polynomial may be less than the block error rate threshold. Thus, an early termination of the iteration convergence scheme may be used with a relatively low likelihood of error. Power may therefore be conserved by the early termination of the iterative convergence scheme without substantially increasing the likelihood of errors.

Referring to FIG. 11, the method may optionally further include additional processing during each iteration. For example, the method may include, during each iteration, determining the discrepancy factor for the iteration, at 1108, and incrementing a zeros counter in response to the discrepancy factor being zero, at 1110. The method may further include resetting the zeroes counter in response to a discrepancy factor being non-zero, at 1112, and comparing a value of the zeros counter to the predetermined number at the comparator, at 1114. To illustrate, the zeros counter may be the counter 512 of FIG. 5 that increments when ($D_\mu$) is equal to zero and resets when ($D_\mu$) is not equal to zero. The counter value may be compared to the value of 522 of FIG. 5 by the comparator 514 to generate the termination signal 420.

Although various components depicted herein are illustrated as block components and described in general terms, such components may include one or more microprocessors, state machines, or other circuits configured to enable the memory device 104 of FIG. 1, the control circuit 202 of FIG. 2, the residuals calculation circuitry 302 of FIG. 3, the error location polynomial generator 402 of FIG. 4, the termination control circuitry 502 of FIG. 5, or the systems of FIG. 1-4 to perform the particular functions attributed to such components, or any combination thereof. For example, the BCH decoder 120 of FIG. 1 may represent physical components, such as hardware controllers, state machines, logic circuits, or other structures to enable the memory device 102 of FIG. 1 to decode data using a reduced number of residuals.

For example, the BCH decoder 120 may be implemented using dedicated circuitry configured to perform decoding of codewords. Alternatively, or in addition, portions of the BCH decoder 120 may be implemented using a microprocessor or microcontroller programmed to perform decoding. In a particular embodiment, the BCH decoder 120 includes executable instructions that are executed by a processor and the instructions are stored at the memory array 104, such as a flash memory array. Alternatively, or in addition, executable instructions that are executed by a processor that may be included in the BCH decoder 120 may be stored at a separate memory location that is not part of the memory array 104, such as at a read-only memory (ROM) (not shown).

In a particular embodiment, the memory device 102 of FIG. 1 may be a portable device configured to be selectively coupled to one or more external devices, such as a host device. However, in other embodiments, the memory device 102 may be attached or embedded within one or more host devices, such as within a housing of a portable communication device. For example, the memory device 102 may be within a packaged apparatus such as a wireless telephone, a personal digital assistant (PDA), a gaming device or console, a portable navigation device, or other device that uses internal non-volatile memory. The memory device 102 may include a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of decoding data, the method comprising:
   at a decoder configured to generate up to a first number of residual values to correct errors within data representing a corrupted codeword:
      receiving the data representing the corrupted codeword;
      before determining a syndrome associated with the received data., generating a first set of residual values, the first set of residual values having a second number of residual values corresponding to the received data, wherein the second number of residual values is less than the first number of residual values;
      determining whether the received data representing the corrupted codeword is decodable using the first set of residual values; and
      in response to determining that the received data is decodable using the first set of residual values, generating decoded data corresponding to the codeword.

2. The method of claim 1, further comprising:
   in response to determining that the received data is not decodable using the first set of residual values, determining a second set of residual values corresponding to the received data, the second set of residual values comprising the first number of residual values.

3. The method of claim 1, wherein the decoder comprises residual calculation circuitry that includes a plurality of residual calculation circuits, and wherein at least one residual calculation circuit is selectively disabled during generation of the first set of residual values.

4. The method of claim 3, wherein the at least one residual calculation circuit is selectively disabled while another residual calculation circuit remains active.

5. The method of claim 4, further comprising selectively blocking a clock signal to the at least one residual calculation circuit.

6. The method of claim 1, further comprising:
   determining a reduced number of errors to be correctable at the decoder, wherein the reduced number of errors is less than a first number of errors; and
   determining the second number of residual values based on the reduced number of errors.

7. The method of claim 6, wherein the reduced number of errors is determined at least partially based on an estimated number of errors of the received data.

8. The method of claim 6, wherein the reduced number of errors is determined at least partially based on a failure threshold.

9. The method of claim 6, wherein the second number of residual values is determined based on an iterative convergence scheme that terminates in response to a degree of an error location polynomial equaling or exceeding the first number of errors.

10. The method of claim 6, wherein the second number of residual values is determined based on an iterative convergence scheme that terminates in response to a predetermined number of sequential discrepancy factors equaling zero during the iterative convergence scheme prior to a degree of an error location polynomial equaling the first number of errors.

11. The method of claim 10, wherein the received data is read from a flash memory array having a block error rate threshold, and wherein the predetermined number of sequential discrepancy factors is determined at least partially based on the block error rate threshold.

12. A data decoding device comprising:
    an error correction code (ECC) engine configured to generate residual values to correct errors within a codeword that has been corrupted, wherein the ECC engine is adapted to generate a first number (p) of residual values to correct not more than a first number of errors (t) of the corrupted codeword when the corrupted codeword has a first codeword size (s), the ECC engine comprising:
       a plurality of residual calculation circuits to generate a first set of residual values before a syndrome associated with the corrupted codeword is generated, the first set of residual values having a second number (r') of residual values, the second number (r') less than the first number (p);
       a syndrome generator circuit coupled to receive the first set of residual values via an output of the plurality of residual calculation circuits; and
       a control logic circuit configured to initiate generation of the first set of residual values, wherein an operation of at least one residual calculation circuit is disabled during generation of the first set of residual values.

13. The data decoding device of claim 12, wherein the control logic circuit is further configured to:
    receive an indication of whether the corrupted codeword is decodable using the first set of residual values; and
    in response to the indication indicating that the corrupted codeword is not decodable using the first set of residual values, initiate generation of a second set of residual values corresponding to received data representative of the corrupted codeword, the second set of residual values comprising the first number (p) of residual values.

14. The data decoding device of claim 13, wherein the ECC engine further comprises:
    an error location polynomial generator coupled to receive an output of the syndrome generator circuit; and
    an error location and correction circuit coupled to receive an output of the error location polynomial generator.

15. The data decoding device of claim 14, wherein the error location polynomial generator generates the indication of whether the received data is decodable using the first set of residual values.

16. The data decoding device of claim 14, wherein the error location polynomial generator is configured to generate data corresponding to an error location polynomial using an iterative convergence scheme that terminates in response to a predetermined number of sequential discrepancy factors equaling zero.

17. The data decoding device of claim 12, further comprising a circuit responsive to the control logic circuit to send a clock disable signal to the at least one residual calculation circuit.

18. A method comprising:
at a decoder including a plurality of residual calculation circuits, the plurality of residual calculation circuits comprising a first number (p) of residual calculation circuits, wherein a first number (t) of errors of a corrupted codeword is correctable using the first number (p) of residual calculation circuits:
  selectively disabling an operation of at least one residual calculation circuit during generation of a first set of residual values corresponding to the corrupted codeword, the first set of residual values having a second number (r') of residual values that is less than the first number (p) of residual calculation circuits, the second number (r') of residual values determined to correct a second number (r) of errors within the corrupted codeword, wherein the second number (r) of errors is less than the first number (t) of errors; and
  initiating generation of the first set of residual values corresponding to received data before a syndrome associated with the received data is calculated; and
  generating the syndrome using the first set of residual values.

19. A method of decoding data, the method comprising:
at a decoder configured to correct a first number of errors within a codeword that has been corrupted:
  receiving data representing the corrupted codeword;
  before determining a syndrome associated with the received data, generating a first set of residual values, the first set of residual values having a second number of residual values corresponding to the received data, wherein the second number of residual values is less than a first number of residual values;
  initiating an iterative convergence scheme to generate an error location polynomial, wherein each particular iteration of the iterative convergence scheme includes updating the error location polynomial and determining a discrepancy factor corresponding to the particular iteration; and
  generating a count of sequential iterations of the iterative convergence scheme that correspond to a zero discrepancy factor and terminating the iterative convergence scheme in response to the count equaling a threshold, wherein the iterative convergence scheme is terminated prior to a degree of the error location polynomial equaling the first number of errors.

20. The method of claim 19, wherein the received data is read from a flash memory array.

21. The method of claim 20, wherein a block error rate threshold corresponds to the flash memory array, and wherein the threshold is determined at least partially based on the block error rate threshold.

22. The method of claim 21, wherein a probability that the iterative convergence scheme terminates prior to determining an actual convergence value of the error location polynomial is less than the block error rate threshold.

23. The method of claim 19, further comprising, during each iteration:
  determining the discrepancy factor for the iteration;
  incrementing a zeros counter in response to the discrepancy factor being zero;
  resetting the zeros counter in response to the discrepancy factor being non-zero; and
  comparing a value of the zeros counter to the threshold.

24. A data storage device comprising:
a flash memory;
a flash controller coupled to the flash memory; and
an error correction code (ECC) engine responsive to the flash controller and configured to generate residual values to correct errors within a codeword that has been corrupted, wherein the ECC engine is adapted to generate a first number (p) of residual values to correct not more than a first number of errors (t) of the corrupted codeword when the corrupted codeword has a first codeword size (s), the ECC engine comprising:
  a plurality of residual calculation circuits to generate a first set of residual values before a syndrome associated with the corrupted codeword is generated, the first set of residual values having a second number (r') of residual values, the second number (r') less than the first number (p);
  a syndrome generator circuit coupled to receive the first set of residual values via an output of the plurality of residual calculation circuits; and
  a control logic circuit configured to initiate generation of the first set of residual values, wherein an operation of at least one residual calculation circuit is disabled during generation of the first set of residual values.

* * * * *

UNITED STATES PATENT AND TRADEMARK OFFICE
CERTIFICATE OF CORRECTION

PATENT NO.       : 8,301,987 B2
APPLICATION NO.  : 12/608411
DATED            : October 30, 2012
INVENTOR(S)      : Itai Dror et al.

Page 1 of 1

It is certified that error appears in the above-identified patent and that said Letters Patent is hereby corrected as shown below:

In the Claims section, Column 17, Claim 1, Line 34, "received data., generating a first set of residual values," should read --received data, generating a first set of residual values,--.

Signed and Sealed this
Thirtieth Day of April, 2013

Teresa Stanek Rea
*Acting Director of the United States Patent and Trademark Office*